(12) United States Patent
Peter et al.

(10) Patent No.: US 7,995,340 B2
(45) Date of Patent: Aug. 9, 2011

(54) VENTILATION DEVICE VENTILATING AN ELECTRONIC MODULE

(75) Inventors: Guillaume Peter, Jouy-en-Josas (FR); Xavier Le Pennec, Trappes (FR)

(73) Assignee: General Electric Company, Schenectady, NY (US)

( * ) Notice: Subject to any disclaimer, the term of this patent is extended or adjusted under 35 U.S.C. 154(b) by 335 days.

(21) Appl. No.: 11/775,576

(22) Filed: Jul. 10, 2007

(65) Prior Publication Data
US 2008/0049395 A1 Feb. 28, 2008

(30) Foreign Application Priority Data

Jul. 11, 2006 (FR) ...................................... 06 52920

(51) Int. Cl.
*H05K 7/20* (2006.01)
(52) U.S. Cl. ............. 361/695; 454/184; 55/283; 417/45
(58) Field of Classification Search .................... 361/31, 361/690, 694, 695, 697, 679.48
See application file for complete search history.

(56) References Cited

U.S. PATENT DOCUMENTS

| 6,152,699 | A | 11/2000 | Shikata et al. |
| 6,496,368 | B2 * | 12/2002 | Jui-Yuan ....................... 361/697 |
| 6,537,019 | B1 * | 3/2003 | Dent ................................ 415/61 |
| 6,885,176 | B2 * | 4/2005 | Librizzi ........................ 323/285 |
| 2002/0101714 | A1 | 8/2002 | Osecky et al. |
| 2004/0184206 | A1 * | 9/2004 | Nomura et al. ................. 361/31 |
| 2006/0191668 | A1 | 8/2006 | Lai ............................ 165/104.33 |
| 2007/0131409 | A1 * | 6/2007 | Asahi ............................ 165/287 |
| 2007/0207721 | A1 * | 9/2007 | Chang .......................... 454/184 |

FOREIGN PATENT DOCUMENTS

| EP | 1061787 A2 | 12/2000 |
| JP | 02081396 A | 3/1990 |

* cited by examiner

*Primary Examiner* — Jayprakash N Gandhi
*Assistant Examiner* — Courtney Smith
(74) *Attorney, Agent, or Firm* — Global Patent Operation; Jonathan E. Thomas

(57) ABSTRACT

An electronic module comprises a ventilation device used for the efficient cooling of the components of this module while at the same time minimizing the accumulation of solid particles. To this end, a selector switch is placed between an electrical power supply unit of the module and a motor of the ventilation device. This selector switch cyclically modifies the sense of rotation of the fan in order to suck in an airflow to cool the components and expel the airflow in order to expel the solid particles located in the module and on the ventilation device.

9 Claims, 2 Drawing Sheets

VENTILATION DEVICE VENTILATING AN ELECTRONIC MODULE

BACKGROUND OF THE INVENTION

1. Field of the Invention

An object of the present invention is a ventilation device ventilating an electronic module or module. The ventilation device is designed to cool components of the module and expel solid particles contained in this module. To do this, the ventilation device has an airflow inverter. The airflow inversion is done cyclically. The present invention can be applied in various fields. It can be implemented in systems, sets, apparatuses, machines, equipment and installations.

2. Description of Related Art

At present, there are various systems provided with ventilation devices. The ventilation device introduces a flow of fluid into the system in order to cool electrical or electronic components of said system. This cooling prevents malfunctions caused by to excessive temperature in these components.

This type of ventilation device can be placed advantageously but not exclusively in a central processing unit of a computer or in an electronic module.

The ventilation device has a motor powered with electrical energy. This motor converts the electrical energy into mechanical energy. The ventilation device has a fan formed by a shaft with blades fixed to a hub of the shaft. The motor actuates the rotation of the fan in providing it with mechanical energy. This rotation of the fan causes the blades to be put into motion, forcing the passage of air from outside the central processing unit or electronic module into the central processing unit or electronic module in order to cool the electronic and electrical components.

However, these ventilation devices have drawbacks. Indeed, the air sucked in or drawn in by the blades contains solid particles such as dust. Over time, the solid particles collect on the electrical and electronic components, on the blades of the ventilation device and in every nook and corner of the central processing unit or electronic module. This causes a loss of efficiency of the ventilation device which no longer cools the components of the central processing unit or electronic module efficiently. The components of the central processing unit or of the electronic module are the then constantly subjected to excess of temperature.

This constant excess of temperature with the accumulation of solid particles on said components causes the destruction of these components prompting the malfunctioning of the central processing unit or electronic module.

The excessive temperature of the components is also due to the layer of solid particles which acts as a heat insulator and prevents the components from cooling down. This layer of solid particles may also be deposited on an electrical conductor and prompt short-circuits. The accumulation of solid particles causes disturbance in the working of the central processing unit or the electronic module which therefore becomes highly sensitive to dust, heat, cold and problems of electrical power supply. The central processing unit or the electronic module this proves to be more fragile and less reliable. Consequently, malfunctions may occur in an untimely way, giving rise to chaotic functioning.

Furthermore, malfunctions in the ventilation device may occur because of the accumulation of solid particles on the fan, the blades and the motor. Indeed, the solid particles interfere with the contacts of the motor and get mixed with the grease injected by the rotation, hampering the efficient operation of the rotation of the fan. With current ventilation devices, these faults are not detected.

When the ventilation device no longer carries out the component-cooling function, there is a great risk that the components of the central processing unit or the electronic module might get overheated or might even melt down. It is therefore important to control, firstly, the cleanliness of the ventilation device because an excess of solid particles reduces the airflow and, secondly, the efficient operation of the blades of the fan.

To reduce this accumulation of solid particles, there are protective screens or air filters generally placed in front of the blades. A protective screen is designed to cleanse the air sucked in by the blades to prevent solid particles from collecting on the components or on the ventilation device.

However, this protective screen does not eliminate the accumulation of solid particles but simply slows down the time of accumulation of these solid particles. Thus, after each period of use, the protective screen has to be regularly cleaned in order to ensure constant cooling of the components. Regular maintenance of the screen is necessary to reduce the accumulation of dust, especially on the ventilation device integrated into the central processing unit or the electronic module. Like the screen, all the components of the processing unit or electronic module to have to be regularly cleaned.

To carry out this cleaning, the central processing unit or the electronic module is switched off and disconnected from the mains. The central processing unit of the electronic module has to be dismounted in order to obtain access to all the compartments and unscrew the ventilation device before the cleaning is done. Because of its specific features, the cleaning of the central processing unit or electronic module requires real specialists. The central processing unit or the electronic module is thus switched off for a relatively lengthy maintenance time, thus reducing productivity.

As a consequence, the ventilation techniques presented do not make it possible to reduce the number of maintenance operations on the central processing unit or the electronic module or to reduce the accumulation of solid particles in the central processing unit or the electronic module.

SUMMARY OF THE INVENTION

The invention is aimed precisely at overcoming the drawbacks of the techniques explained here above. To this end, the invention proposes to modify the ventilation techniques of existing ventilation devices with the aim of minimizing the accumulation of solid particles and the number of maintenance operations.

The invention proposes a novel approach to ventilation devices that makes advantageous use of ventilation techniques for the cyclical cooling of the components of the central processing unit with a constant airflow while at the same time minimizing the accumulation of solid particles. To do this, the invention comprises an inverter placed between an electrical power supply unit of the central processing unit and a motor of the ventilation device. This inverter cyclically modifies the sense of rotation of the fan in order to suck in a flow of air to cool down the component and expel the airflow in order to expel the solid particles located in the central processing unit and in the ventilation device.

More specifically, an object of the invention is a ventilating device ventilating an electronic module and being supplied with electrical energy by a power supply unit of the module,
  the ventilation device comprising a motor, a fan fixed to the motor, the fan being formed by a shaft and at least one blade fixed to a hub of the shaft, a protective screen comprising an anti-dust filter, the device comprising:
  a selector switch connected between the power supply unit and a motor of the ventilation device, each state of the selector switch corresponding to a sense of rotation of the motor,
  the switching of the selector switch being commanded by a control circuit.

In non-restrictive embodiments, the ventilation device of the invention comprises the following additional characteristics:
  the switching control circuit is a bistable circuit.
  the switching control circuit is a pulse generator.
  the switching control circuit is a microcontroller.
  the switching control circuit switches the selector switch according to a predefined switching cycle duration.
  the duration of the high state cycle of the selector switch corresponding to a reverse sense of rotation of the motor is greater than the duration of the low state cycle of the selector switch corresponding to a forward sense of rotation of the motor.
  as soon as the power supply unit is powered on, the switching control circuit first of all switches the selector switch to the low state for a predefined period of time before calibrating the duration of the switching cycle on a clock signal.
  the control circuit has commands capable of short-circuiting the power supply unit when anomalies are detected in the module.
  the device has a monitor on which the type of anomalies detected can be displayed.
  the device has a sound alarm or visual alarm activated when a diminishing of the efficiency of the ventilation device is detected.

BRIEF DESCRIPTION OF THE DRAWINGS

The invention will be understood more clearly from the following description and the accompanying figures. These figures are given by way of an indication and in no way restrict the scope of the invention. Of these figures.

DETAILED DESCRIPTION OF EMBODIMENTS OF THE INVENTION

Figure 1:
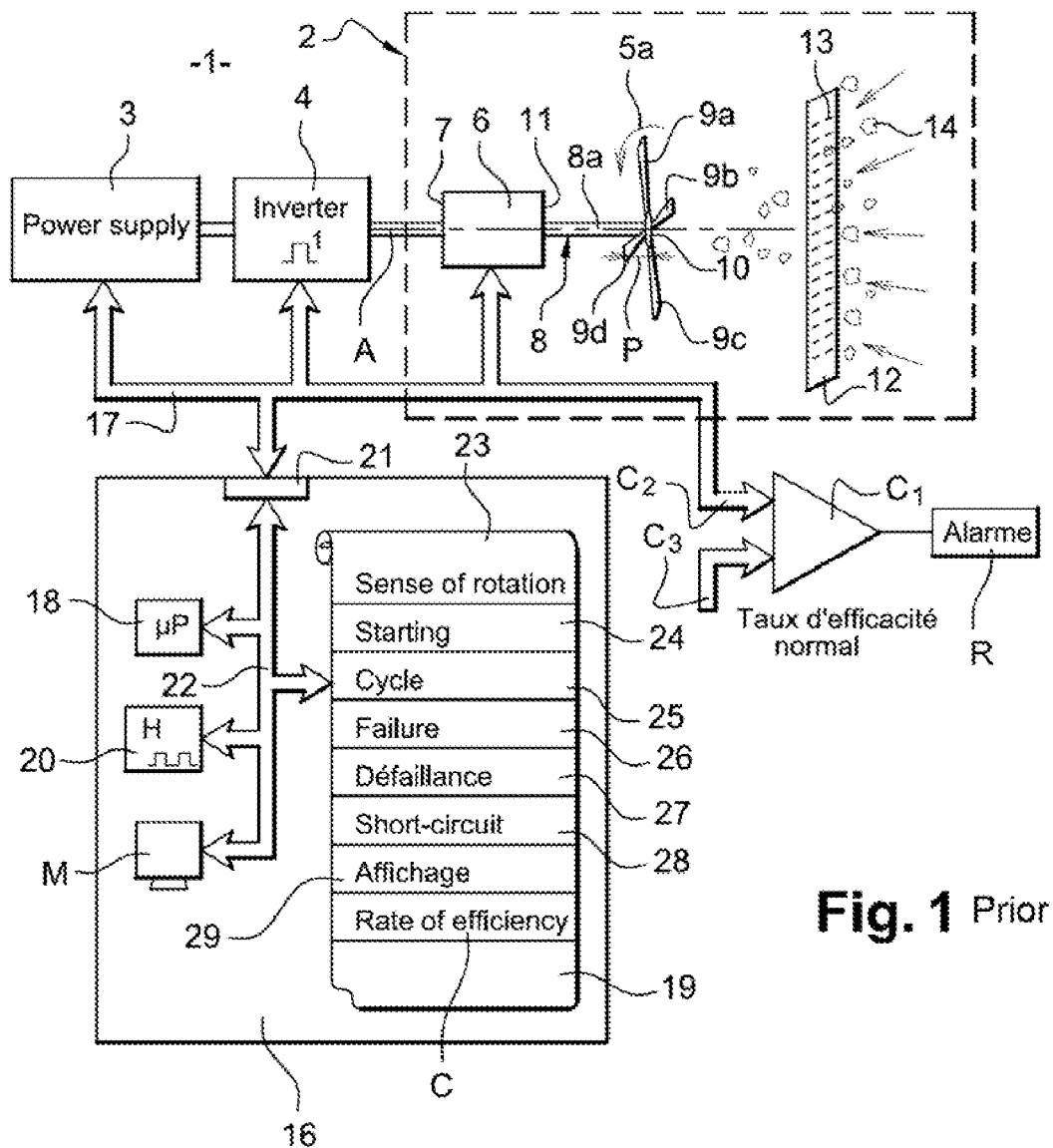
FIG. 1 is a schematic view of an electronic module comprising a ventilation device working by airflow suction according to the invention.

FIG. 1 provides a schematic view of an electronic module 1 comprising at least one ventilation device 2 of the invention. This electronic module 1 may be a central processing unit or any other system for which it is necessary to use a ventilation device in order to cool components.

This module 1 has a power supply unit 3. This power supply unit 3 is a source of DC voltage. In a preferred example, the power supply unit 3 is a battery or a rectified network. It supplies the ventilation device 2 with electrical power.

The module 1 has a selector switch 4. This selector switch 4 is placed between the power supply unit 3 and the ventilation device 2. This selector switch 4 is a switch with an additional state. Each state of the selector switch 4 is associated with one sense of rotation, i.e. a reverse sense of rotation 5a or a forward sense of rotation 5b, namely the clockwise sense, of the ventilation device 2.

The ventilation device 2 has a motor 6. The selector switch 4 is connected to the rear 7 of the motor 6. The placing of the selector switch 4 at this position 6 adapts the electrical energy received by the motor 6 of the ventilation device so as to provide for a reversal of the sense of rotation of the motor 6. The motor 6 is designed to convert electrical energy received from the power supply unit 3 into mechanical energy.

As soon as the power supply unit 3 is powered on, the motor 6 goes into a rotational motion whose sense is defined by the state of the selector switch 4. When the power supply unit 3 is powered off, the motor 6 stays in the position taken at the time of interruption of the current.

The ventilation device 2 has a fan 8. The fan 8 has a shaft 8a provided with at least one blade 9a. In the example of FIG. 1, the shaft 8a is provided with four blades evenly positioned about an axis A of the shaft 8a. The blades 9a, 9b, 9c and 9d are fixed to a hub 10 of the shaft 8a. The angle formed by two consecutive blades is a pitch P of blades. The pitch P of blades may be increased or reduced in order to provide for a greater or lesser stirring of the air to vary the cooling of the module or expel solid particles.

The fan 8 is fixed to the front face 11 of the motor 6. The motor 6 provides the fan 8 with converted mechanical energy, prompting rotation of the fan about the axis A of the fan 8. The sense of rotation of the fan 8 is the same as that of the motor 6.

The rotation of the fan 8 enables the blades 9a, 9b, 9c et 9d to suck in air and expel it toward the rear of the module 1.

The ventilation device may comprise a protective screen 12. This protective screen may be made out of a rigid, plastic material or a metal. This protective screen has an anti-dust filter 13. This anti-dust filter 13 is made out of a material whose surface has calibrated holes made by wire-screen weaving.

This anti-dust filter 13 enables the retaining, during the passage of air, of solid particles 14 such as dust. The example of FIG. 1 shows the normal mode of operation of a prior-art ventilation device. The ventilation device in this case behaves like a cooling device designed to promote the discharge of the calories dissipated by the electrical or electronic components of the module 1.

As the air is sucked in and pushed into the module, the dust is also drawn inwards into the module 1, causing the problem of accumulation of solid particles seen in prior art ventilation devices.

The selector switch 4 is controlled by a control logic unit 16. The control logic unit 16 is the control circuit of the selector switch 4. The control logic unit 16 sends the selector switch 4 a switching signal by means of an external bus 17. This prior-art reversing signal enables the selector switch 4 to reverse the sense of rotation of the fan 8 or to keep it.

In one variant, the selector switch 4 may be controlled by a bistable circuit, a signal generator or any other adapted electronic circuit.

The logic control unit 16 is often made in integrated-circuit form. In one example, the logic commands circuit 16 comprises a microprocessor 18, a program memory 19, a clock 20, a monitor M and an input/output interface 21. The microprocessor 18, the program memory 19, the clock 20, the monitor M and the input/output interface 21 are interconnected by an internal bus 22.

In practice, when a device is said to perform an action, this action is performed by a microprocessor of the device controlled by instruction codes recorded in a program memory of the device. The control logic unit 10 is such a device.

The program memory 19 is divided into several zones, each zone corresponding to instruction codes to perform a function of the device. The memory 19 has a zone 23 comprising instruction codes to determine a preferred sense of rotation of the motor 6. The memory 19 has a zone 24 comprising instruction codes to start the operation of the ventilation device as soon as the power supply unit 3 is powered on.

The memory 19 has a zone 25 comprising instruction codes to define a cycling duration for each state of the selector switch 4. The memory 19 has a zone 26 comprising instruction codes to switch the selector switch 4 over cyclically as a function of the duration of each state of the selector switch 4 calibrated on the clock signal 20.

The memory 19 has a zone 27 comprising instruction codes to detect a failure in the power supply unit 3 and/or the ventilation device 2 and/or the selector switch 4. The memory 19 has a zone 28 comprising instruction codes to short-circuit the power supply unit 3 upon the detection of failure by the instruction codes of the zone 27. The memory 19 has a zone 29 comprising instruction codes for the display, on the monitor M, of the type of failure detected by the instruction codes of the zone 27. The memory 19 has a zone C comprising instruction codes to compute an efficiency or rate of efficiency of the ventilation device. This computation is done, in one example, as a function of the variation in the temperatures of the electrical or electronic components of the module 1.

The change of state of the selector switch 4 leads to a change in the sense of rotation 5a or 5b of the motor 6 producing an expulsion or suction of airflow as the case may be. The example of FIG. 1 shows a suction of airflow. In this case, the selector switch 4 is in the high state and the sense of rotation of the fan is the counter clockwise sense 5a.

The module 1 comprises a comparator C1 and two inputs E1, E2 and one output S. The output S is connected to a sound alarm or visual alarm. Through an external communications bus 17, the input receives the result of computation of the rate of efficiency of the ventilation device carried out by the control logic unit 16. The input E2 receives a predefined rate of efficiency of the ventilation device 2. This predefined rate of efficiency of the ventilation device 2 is obtained by computation or by simulation.

The comparator C1 performs a real-time simulation of the two rates of efficiency given by the two inputs E1 and E2. Once the rate of efficiency computed by the control logic 16 falls below the predefined rate of efficiency, the alarm is set off.

The activation of the alarm informs the user about the state of the ventilation device 2 without in any way making it necessary to dismount it in order to verify its state.

Figure 2:
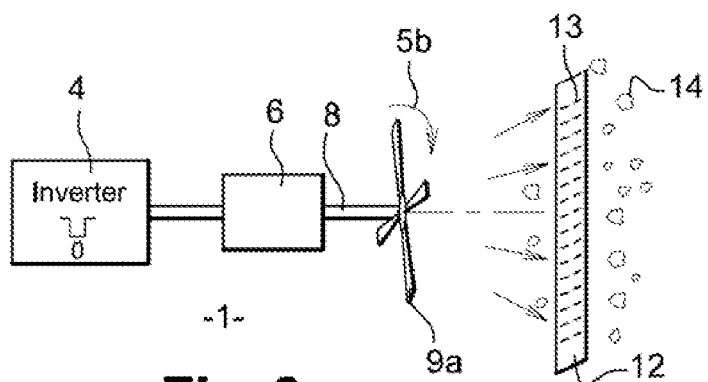
FIG. 2 is a schematic view of an electronic module comprising a ventilation device working by airflow expulsion according to the invention, FIG. 3 provide an illustration in a graph of the steps of operation of the electronic module according to the invention.

FIG. 2 is a schematic view of the ventilation device of the invention. In the example of FIG. 2, the airflow is expelled out of the module 1. In this case, the selector switch 4 is in the low state. The sense of rotation 5b of the fan is the forward or clockwise sense.

The top state and low state of the selector switch 4 may give rise to senses of rotation of the fan 8 different from those described here above. A sense of rotation of the motor 6 is made to correspond preliminarily with each state of the selector switch 4.

When the sense of rotation of the motor is the forward sense 5b, an airflow is expelled from inside the module to the outside. This expulsion of the airflow causes an expulsion of solid particles 14 that are on the protective screen, the ventilation device and the components of the module. This expulsion of the solid particles 14 considerably reduces their accumulation in the module.

The selector switch is switched over to the high state by the control logic unit cyclically during a first predefined period. Then it is switched over to the low state during a second predefined period. The first and second periods form a cycle. In one example, for a one-hour cycle, the selector switch is switched over to the high state for 45 minutes and to the low state for 15 minutes.

Since the primary function of the example of the invention is to cool down the components of the module, the time during which the selector switch is switched to the high state is greater than the time during which the selector is switched to the low state.

In general, a switching cycle duration T0 of the selector switch 4 is predefined. The control logic unit reverses the sense of rotation of the motor by a predefined fraction F. Consequently, for a one-cycle duration, the normal cooling operation is carried out for a duration of T0 (1-F). And an expulsion operation is performed for a duration FT0. The value F is adjusted so as to keep the mean efficiency of the ventilation device constant in order to cool the electrical or electronic components of the module 1.

Figure 3:
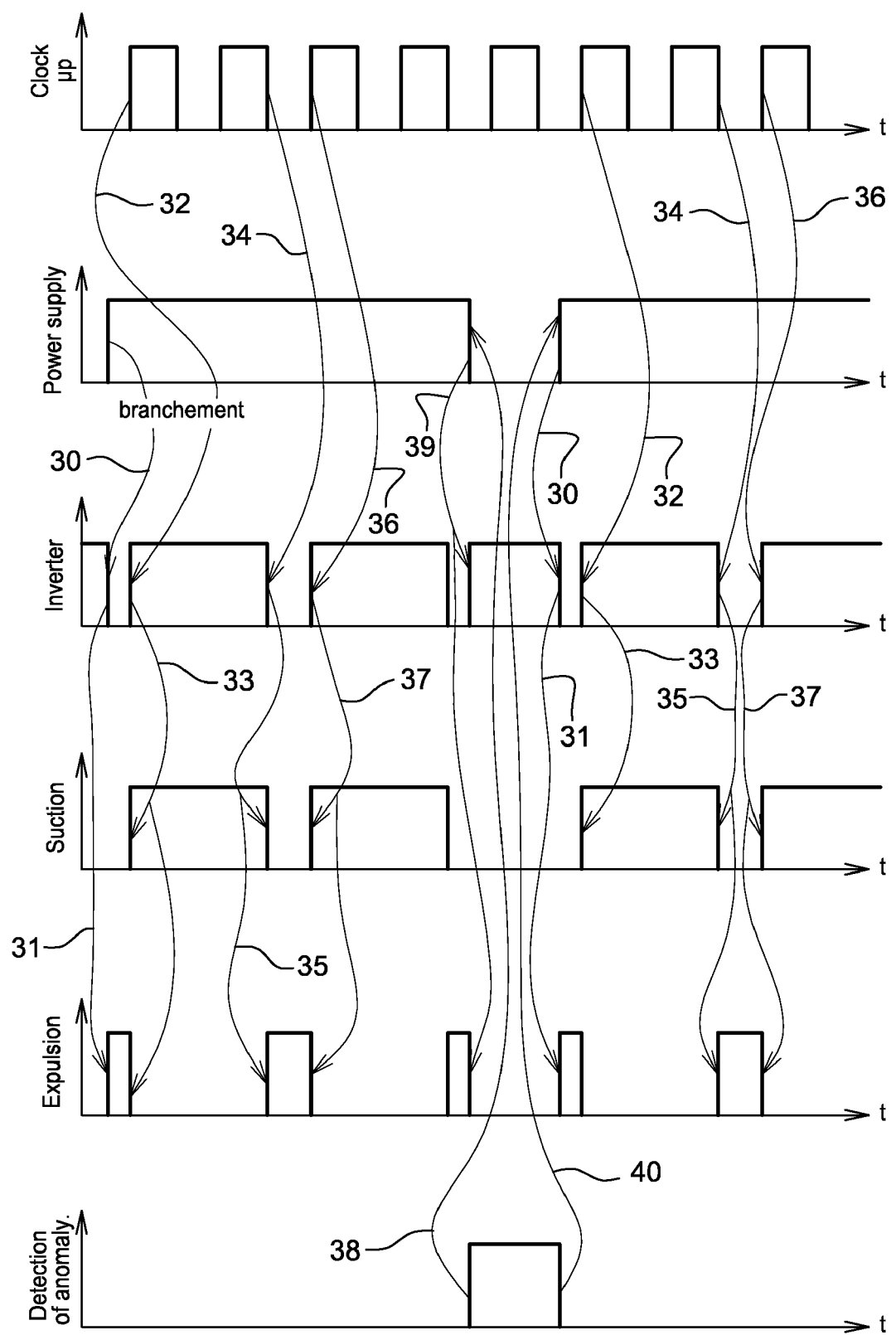

FIG. 3 illustrates steps of operation of the module 1 of the invention. Before the power supply unit is powered on, the control logic unit prepares a preferred sense of rotation of the blades of the fan. This sense of rotation is defined as a function of the different modes of application of the module of the invention. In the example of the invention, the preferred sense is the sense enabling the components to be cooled. Thus, the selector switch is placed in the high state.

Once the power supply unit is put into operation, the control logic unit switches the selector switch, in a step 30, to the low state. This switching leads, in the step 31, to a forward sense of rotation of the motor giving rise to an expulsion of the airflow out of the module. This step 31 preferably lasts a few seconds.

In one variant, it is possible for the control logic unit not to apply this step 30 for switching the selector switch to the low state. This step is optional.

In the step 32, the control logic unit calibrates the time of the cyclical signal of the selector switch with that of the clock. As soon as the calibration step 32 is done, the control logic unit switches the selector switch to the high state, causing a change in the sense of rotation of the motor at the step 33. At the step 33, the ventilation device is in a state of sucking in or drawing in an airflow.

As soon as the second clock stroke takes place, the control logic unit switches the selector switch to the low state. This switching causes a change in the sense of rotation of the motor to the forward sense 5b. In the step 35, the sense of rotation of the blades of the fan prompts an expulsion of the solid particles out of the module. At the next clock stroke, in this step 36, the control logic unit switches the selector switch to the high state. This switching causes the sense of rotation of the motor to change into the reverse sense 5a giving rise to a suction of airflow in the step 37.

The process continues in this way until a detection of failure in the module by the control logic unit in the step 38. This failure may have several causes. It may be due to a loss of quantity of airflow sucked in, providing information on the state of regulation of the solid particles. It may be due to a malfunction or failure of one of the components of the module or to an increase in the temperature of the components. It may also be due to a malfunction or failure of the power supply block of the module etc.

At the failure step 38, the control logic unit short-circuits the power supply unit leading to a halt in the operation of the various elements of the module. The rotation of the motor is stopped. The control logic unit switches the selector switch to the high state in the step 39.

In one example, this detection may be transmitted to a monitor in order to enable a user to obtain knowledge of the nature of the failure and be capable of correcting it.

When the control logic unit no longer detects the failure signal, in the step 40, the power supply unit may be started again. As soon as the power supply block is turned on, the control logic unit again applies the steps 30 to 37 until a new detection of failure.

The ventilation device of the invention reduces the accumulation of solid particles on the blades of the fan that may cause malfunction. It also reduces the cost of preventive maintenance since there is less accumulation of solid particles. Furthermore, this minimizing of the accumulation of solid particles gives rise to an almost constant temperature of the components providing for greater mean times between failures (MTBF).

This mean time of the between failure is a mean duration during which a system will continue to work under determined conditions between two successive malfunctions.

The ventilation device of the invention therefore gives improved reliability to the systems that contain it.

What is claimed is:

1. A ventilation device ventilating an electronic module and being supplied with electrical energy by a power supply unit, the ventilation device comprising:
   a motor;
   a fan fixed to the motor, the fan comprising a shaft and at least one blade fixed to a hub of the shaft;
   a protective screen comprising an anti-dust filter;
   a selector switch connected between the power supply unit and a motor of the ventilation device: and
   a control circuit connectable to the selector switch,
   a comparator circuit coupled to the control circuit; and
   an alarm coupled to the comparator circuit,
   wherein the selector switch has a plurality of states,
   wherein each state corresponds to a sense of rotation of the fan,
   wherein the sense of rotation comprises a first sense and a second sense that is opposite of the first sense, and
   wherein the control circuit is configured to switch the selector switch amongst the plurality of states so as to operate the fan in the first sense for a first duration and the second sense for a second duration, to compute an efficiency from variation in temperature of the electronic module, and to adjust one of the first duration and the second duration by a pre-defined fraction F,
   wherein the control circuit is further configured to adjust the pre-defined fraction F to maintain the efficiency as constant during operation of the electronic module, and
   wherein the comparator circuit generates an output to activate the alarm in response to the computed efficiency deviating from a pre-defined efficiency for said ventilation device.

2. A ventilation device according to claim 1, wherein the control circuit comprises a bistable circuit.

3. A ventilation device according to claim 1, wherein the control circuit comprises a pulse generator.

4. A ventilation device according to claim 1, wherein the control circuit comprises a microcontroller.

5. A ventilation device according to claim 1, wherein the first sense and the second sense correspond to, respectively, a forward direction and reverse direction for the fan, and wherein the first duration is greater than the second duration.

6. A ventilation device according to claim 1, wherein the control circuit comprises a clock with a clock signal, and
   wherein as soon as the power supply unit is powered on, the control circuit switches the selector switch to one of the first sense or the second sense for a predefined period of time before calibrating one of the first duration and the second duration of the based on the clock signal.

7. A ventilation device according to claim 1, wherein the control circuit is configured to short-circuit the power supply unit when an anomaly is detected in the electronic module.

8. A ventilation device according to claim 7, further comprising a monitor, wherein the type of anomaly detected can be displayed on the monitor.

9. A ventilation device according to claim 1, wherein the alarm comprises a sound alarm or a visual alarm, and
   wherein the control circuit is configured to activate the alarm, in response to diminishing of the efficiency.

* * * * *